(12) United States Patent
Kim et al.

(10) Patent No.: US 9,753,345 B2
(45) Date of Patent: Sep. 5, 2017

(54) MOTHER SUBSTRATE FOR DISPLAY DEVICE, METHOD FOR MANUFACTURING THE SAME, AND METHOD FOR MANUFACTURING DISPLAY DEVICE

(71) Applicant: SAMSUNG DISPLAY CO., LTD., Yongin, Gyeonggi-Do (KR)

(72) Inventors: Jong-In Kim, Suwon-si (KR); Sang Yong No, Asan-si (KR); Kook Hyun Choi, Seoul (KR); Sang Ki Kwak, Asan-si (KR); Jang Soo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 844 days.

(21) Appl. No.: 13/732,803

(22) Filed: Jan. 2, 2013

(65) Prior Publication Data

US 2014/0055698 A1    Feb. 27, 2014

(30) Foreign Application Priority Data

Aug. 22, 2012 (KR) .......... 10-2012-0091800

(51) Int. Cl.
*G02F 1/1362* (2006.01)
*H01L 33/00* (2010.01)
(Continued)

(52) U.S. Cl.
CPC ...... *G02F 1/136286* (2013.01); *G02F 1/1337* (2013.01); *G02F 1/13624* (2013.01);
(Continued)

(58) Field of Classification Search
CPC ............ G02F 1/133351; G02F 1/1341; G02F 1/1309; G02F 1/13624; G02F 1/1337
See application file for complete search history.

(56) References Cited

U.S. PATENT DOCUMENTS 7,969,396 B2    6/2011   Kim
2007/0126940 A1*  6/2007  Lee .................... G02F 1/13624
                                                      349/38

(Continued)

FOREIGN PATENT DOCUMENTS

JP          3500779 B2      12/2003
KR      1020120060996 A     6/2012
KR      1020130042242 A     4/2013

*Primary Examiner* — Paisley L Arendt
*Assistant Examiner* — Agnes Dobrowolski
(74) *Attorney, Agent, or Firm* — Cantor Colburn LLP

(57) ABSTRACT

A mother substrate for a display device includes: a first mother substrate and a second mother substrate including a plurality of panel regions and facing each other; a first contact electrode and a second contact electrode on the first mother substrate; a common electrode, a first voltage application electrode and a second voltage application electrode separated from each other and on the second mother substrate; and a liquid crystal layer between the first mother substrate and the second mother substrate. The first voltage application electrode is connected to the first contact electrode, and the second voltage application electrode is connected to the second contact electrode. The first voltage application electrode is applied with a first voltage, and the second voltage application electrode is applied with a second voltage different from the first voltage.

9 Claims, 14 Drawing Sheets

(51) Int. Cl.
*G02F 1/1337* (2006.01)
*G02F 1/1345* (2006.01)
*G02F 1/1343* (2006.01)

(52) U.S. Cl.
CPC ...... *H01L 33/0054* (2013.01); *G02F 1/13452* (2013.01); *G02F 2001/134345* (2013.01)

(56) References Cited

U.S. PATENT DOCUMENTS

| | | |
|---|---|---|
| 2007/0159587 A1 | 7/2007 | Kim et al. |
| 2009/0146936 A1 | 6/2009 | Ueda et al. |
| 2010/0007830 A1 | 1/2010 | Kim et al. |
| 2010/0289975 A1 | 11/2010 | Nakagawa |
| 2011/0025967 A1 | 2/2011 | Sohn et al. |
| 2011/0051057 A1* | 3/2011 | Song .................... G02F 1/1393 349/106 |
| 2011/0261028 A1 | 10/2011 | Goh et al. |
| 2011/0310342 A1* | 12/2011 | Kim .................... G02F 1/13452 349/149 |

* cited by examiner

MOTHER SUBSTRATE FOR DISPLAY DEVICE, METHOD FOR MANUFACTURING THE SAME, AND METHOD FOR MANUFACTURING DISPLAY DEVICE

This application claims priority to Korean Patent Application No. 10-2012-0091800 filed on Aug. 22, 2012, and all the benefits accruing therefrom under 35 U.S.C., the entire contents of which are incorporated herein by reference.

BACKGROUND (a) Field

The invention relates to a mother substrate for a display device, a manufacturing method of a mother substrate for a display device, and a manufacturing method of a display device including a mother substrate. More particularly, the invention relates to a mother substrate for a display device having improved visibility and response speed by forming different pretilt angles of liquid crystal molecules of two subpixels, a manufacturing method of the mother substrate for a display device, and a manufacturing method of a display device including the mother substrate.

(b) Description of the Related Art

Liquid crystal displays ("LCDs") are one of the most widely used flat panel displays. An LCD includes a pair of display panels provided with field-generating electrodes, and a liquid crystal ("LC") layer interposed between the two display panels. The LCD displays images by applying signals to the field-generating electrodes to generate an electric field in the LC layer that determines the orientation of LC molecules therein to adjust polarization of incident light.

The LCD includes a thin film transistor array display panel and a common electrode display panel facing each other. The thin film transistor array display panel includes a gate line transmitting a gate signal and a data line transmitting a data signal, and intersecting each other, a thin film transistor connected to the gate line and the data line, and a pixel electrode connected to the thin film transistor. The common electrode panel includes a light blocking member, a color filter and a common electrode. The light blocking member and the color filter may be in the thin film transistor array display panel.

To increase a response speed of the LCD, various methods for the LC molecules to be initially aligned have been proposed for providing a pretilt to the LC molecules. Among the initial alignment methods, in a method in which a prepolymer that is polymerized by light such as ultraviolet rays is used to provide the pretilt to LC molecules, each field generating electrode is applied with a voltage having a desired magnitude before ultraviolet ray exposure.

Also, to make lateral visibility approximate to frontal visibility, it has been proposed that one pixel of an LCD should be bisected into two subpixels, while different voltages are applied thereto to differentiate the light transmittance thereof from each other. However, in a conventional LCD of this method, ultraviolet rays are irradiated in a state that the voltages of two subpixels are equal to each other such that the pretilt angles of the LC molecules of two subpixels are the same. Therefore, there exists a need for an improved LCD having improved visibility and response speed.

SUMMARY

One or more exemplary embodiment of the invention provides a mother substrate for a display device having improved visibility and response speed by forming different pretilt angles of liquid crystal molecules of two subpixels, a manufacturing method of a mother substrate for a display device, and a manufacturing method of a display device.

An exemplary embodiment of a mother substrate for a display device according to the invention includes: a first substrate and a second substrate each including a panel region including the display device, and facing each other; a first contact electrode and a second contact electrode on the first substrate and outside the panel region; a common electrode, a first voltage application electrode, and a second voltage application electrode separated from the first voltage application electrode on the second substrate; and a liquid crystal layer between the first substrate and the second substrate. The first voltage application electrode is connected to the first contact electrode, the second voltage application electrode is connected to the second contact electrode, and the first voltage application electrode is applied with a first voltage, and the second voltage application electrode is applied with a second voltage different from the first voltage.

An exemplary embodiment of a mother substrate for a display device according to the invention further includes: a gate line, a data line and a storage electrode line on the first mother substrate; a first switching element and a second switching element connected to the gate line and the data line; a third switching element connected to the gate line, the second switching element and the storage electrode line; a first subpixel electrode connected to the first switching element; and a second subpixel electrode connected to the second switching element.

The first switching element, the second switching element, and the third switching element may respectively include a first terminal, a second terminal, and a third terminal. The first switching element may include the first terminal connected to the gate line, the second terminal connected to the data line, and the third terminal connected to the first subpixel electrode, the second switching element may include the first terminal connected to the gate line, the second terminal connected to the data line, and the third terminal connected to the second subpixel electrode, and the third switching element may include the first terminal connected to the gate line, the second terminal connected to the storage electrode line, and the third terminal connected to the third terminal of the second switching element.

The first contact electrode may be connected to the data line, and the second contact electrode may be connected to the storage electrode line.

An exemplary embodiment of a mother substrate for a display device according to the invention may further include a third contact electrode on the first mother substrate, and the third contact electrode may be connected to the first voltage application electrode and the gate line.

The first voltage may be higher than the second voltage.
The first voltage may be lower than the second voltage.
The liquid crystal layer may include a liquid crystal molecule and a reactive mesogen.

A first alignment layer on the first mother substrate and a second alignment layer on the second mother substrate may be further included, and the first alignment layer and the second alignment layer may include an alignment material including a reactive mesogen.

Another exemplary embodiment of a mother substrate for a display device according to the invention includes: a first mother substrate and a second mother substrate including a plurality of panel regions and facing each other; a gate line, a data line, and a storage electrode line on the first mother substrate; a first switching element and a second switching element connected to the gate line and the data line; a third switching element connected to the gate line, the second switching element, and the storage electrode line; a first subpixel electrode connected to the first switching element; a second subpixel electrode connected to the second switching element; a common electrode on the second mother substrate; and a liquid crystal layer between the first mother substrate and the second mother substrate and including a plurality of liquid crystal molecules. A pretilt angle of the liquid crystal molecules positioned on the first subpixel electrode is different from a pretilt angle of the liquid crystal molecules positioned on the second subpixel electrode.

An exemplary embodiment of a manufacturing method of a mother substrate for a display device according to the invention includes: providing a first contact electrode and a second contact electrode on a first mother substrate; providing a voltage application electrode on the second mother substrate; dividing the voltage application electrode into a common electrode and a plurality of voltage application electrodes; providing a liquid crystal layer between the first mother substrate and the second mother substrate; connecting the first contact electrode and a first voltage application electrode; connecting the second contact electrode and a second voltage application electrode; applying a common voltage to the common electrode, applying a first voltage to the first voltage application electrode, and applying a second voltage to the second voltage application electrode; and irradiating ultraviolet rays to the first mother substrate or the second mother substrate. The first voltage and the second voltage are different from each other.

The exemplary embodiment of a manufacturing method according to the invention may further include: providing a gate line and a storage electrode line on the first mother substrate; providing a data line on the first mother substrate; providing a first switching element and a second switching element connected to the gate line and the data line and a third switching element connected to the gate line, the second switching element, and the storage electrode line; and providing a first subpixel electrode connected to the first switching element and a second subpixel electrode connected to the second switching element.

The first contact electrode may be connected to the data line, and the second contact electrode may be connected to the storage electrode line.

The exemplary embodiment of a manufacturing method according to the invention may further include: providing a third contact electrode on the first mother substrate; and connecting the third contact electrode and the first voltage application electrode. The third contact electrode may be connected to the gate line.

The liquid crystal layer may include liquid crystal molecules and a reactive mesogen.

An exemplary embodiment of a manufacturing method according to the invention may further include: providing a first alignment layer including an alignment material including a reactive mesogen on the first mother substrate; and providing a second alignment layer including an alignment material including a reactive mesogen on the second mother substrate.

The dividing of the voltage application electrode may include irradiating a laser to the voltage application electrode to separate the common electrode and the plurality of voltage application electrodes from each other.

Another exemplary embodiment of a manufacturing method of a display device according to the invention includes: providing a first mother substrate and a second mother substrate including a plurality of panel regions; providing a first contact electrode and a second contact electrode on a first mother substrate; providing a voltage application electrode on a second mother substrate; dividing the voltage application electrode into a common electrode and a plurality of voltage application electrodes separated from each other; providing a liquid crystal layer between the first mother substrate and the second mother substrate; connecting the first contact electrode and a first voltage application electrode; connecting the second contact electrode and a second voltage application electrode; applying a common voltage to the common electrode, applying a first voltage to the first voltage application electrode, and applying a second voltage to the second voltage application electrode; irradiating ultraviolet rays to the first mother substrate or the second mother substrate; and separating the plurality of panel regions of the first mother substrate and the second mother substrate for each panel region. The first voltage and the second voltage are different from each other.

One or more exemplary embodiment of a mother substrate for a display device, a manufacturing method of a mother substrate for a display device and a manufacturing method of a display device according to the invention have effects as follows.

In one or more exemplary embodiment of the mother substrate for a display device, the manufacturing method of a mother substrate for a display device and the manufacturing method of a display device according to the invention, the voltages between both ends of the liquid crystal layers of two subpixels are different from each other and ultraviolet rays are irradiated such that pretilt angles of the liquid crystal molecule of the two subpixels may be different.

Accordingly, where the pretilt angles of the liquid crystal molecule of the two subpixels are different, a response speed of the liquid crystal molecules may be improved and simultaneously, the visibility may be further improved.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
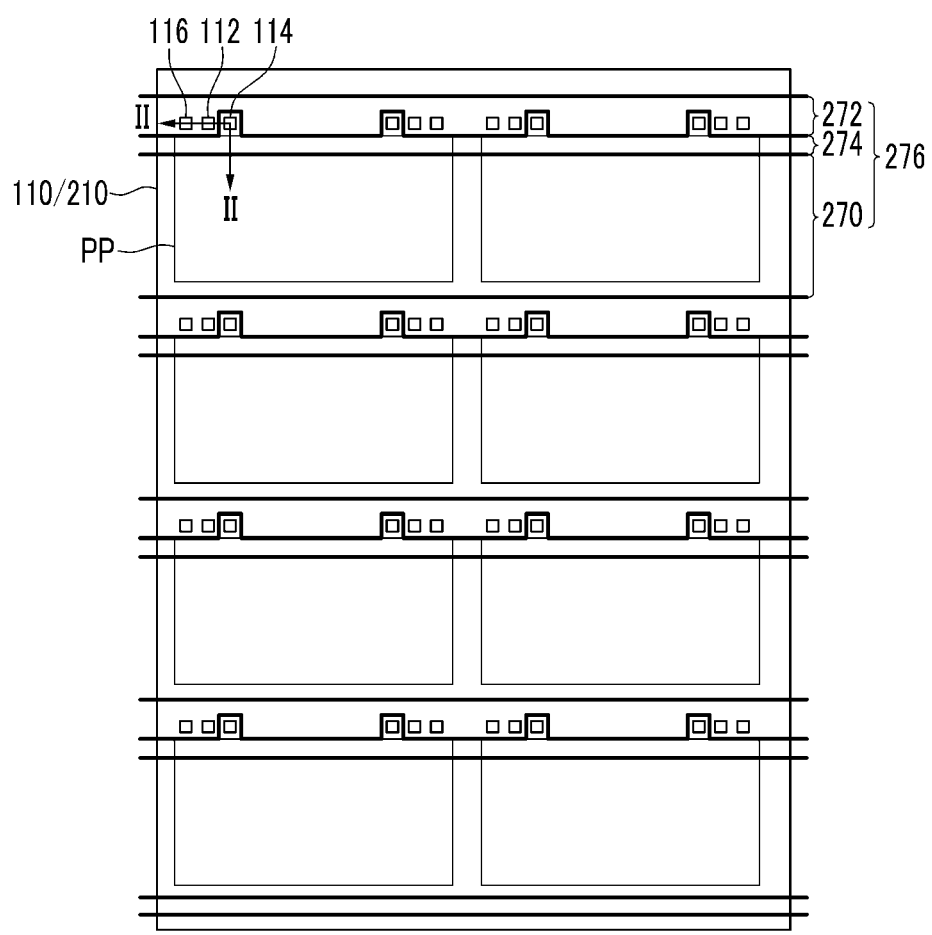
FIG. 1 is a top plan view of an exemplary embodiment of a mother substrate for a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Firstly, a mother substrate for a display device according to an exemplary embodiment of the invention will be described with reference to accompanying drawings.

Figure 2:
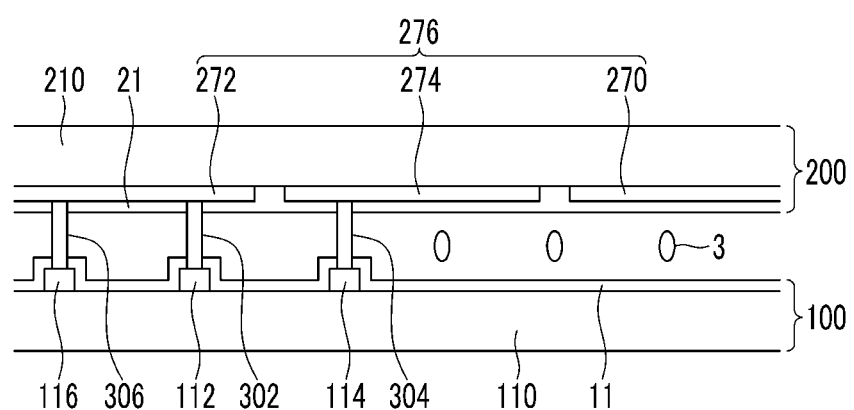
FIG. 2 is a cross-sectional view of the mother substrate for a display device taken along line II-II of FIG. 1.

FIG. 1 is a top plan view of an exemplary embodiment of a mother substrate for a display device according to the invention, and FIG. 2 is a cross-sectional view of the mother substrate for a display device taken along line II-II of FIG. 1.

An exemplary embodiment of a mother substrate for a display device according to the invention includes a plurality of substrates, such as a first substrate 110 and a second substrate 210 facing each other and combined to each other. Hereinafter, the substrates of the mother substrate may also be referred to as a first mother substrate 110 and a second mother substrate 210.

The first mother substrate 110 and the second mother substrate 210 include transparent glass or plastic, and include a plurality of panel regions PP. As shown in FIG. 1, for example, the first mother substrate 110 and the second mother substrate 210 include eight panel regions PP. The panel regions PP may be disposed in a matrix shape. An individual panel region PP may have a substantially rectangular planar shape, but is not limited thereto or thereby. If a cutting process is performed for each panel region PP, one display device is completed for each panel region PP.

The first mother substrate 110 may include one or more of a thin film transistor to form a thin film transistor array display panel 100, the second mother substrate may include a common electrode 270 to form an opposing display panel 200, and a liquid crystal ("LC") layer 3 is between the first mother substrate 110 and the second mother substrate 210. While one or more exemplary embodiment illustrates a LC display device, the invention is not limited thereto or thereby.

A first contact electrode 112, a second contact electrode 114 and a third contact electrode 116 are on the first mother substrate 110 and separated from each other. The first contact electrode 112, the second contact electrode 114 and the third contact electrode 116 are outside the panel region PP. The first contact electrode 112, the second contact electrode 114 and the third contact electrode 116 are used in a manufacturing process of a display device and are not an essential feature in a completed display device such that the first, second and third contact electrodes 112, 114 and 116 are not necessary inside the panel region PP. Accordingly, while performing a cutting process of the first mother substrate 110 and the second mother substrate 210, the first contact electrode 112, the second contact electrode 114 and the third contact electrode 116 may be removed or separated from a remainder of the first and second mother substrates 110 and 120.

A first alignment layer 11 is on the first mother substrate 110. The first alignment layer 11 may cover the first contact electrode 112, the second contact electrode 114 and the third contact electrode 116. The first alignment layer 11 may be a vertical alignment layer, but is not limited thereto or thereby.

A voltage application electrode 276 is on substantially an entire surface of the second mother substrate 210. The voltage application electrode 276 may include a transparent metal such as indium tin oxide ("ITO") and indium zinc oxide ("IZO"). The collective voltage application electrode 276 may include a plurality of electrodes such as the common electrode 270, a first voltage application electrode 272 and a second voltage application electrode 274 that are electrically separated from each other.

A line dividing the common electrode 270, the first voltage application electrode 272 and the second voltage application electrode 274 extends in a horizontal direction, for example, along a left-right direction in FIG. 1. The first voltage application electrode 272, the second voltage application electrode 274 and the common electrode 270 are sequentially repeated from an upper side of the second mother substrate 210, for example, in a top-bottom direction of FIG. 1. A voltage may be applied to a right edge and/or a left edge of the first voltage application electrode 272, the second voltage application electrode 274 and the common electrode 270 from outside the first and second mother substrates 110 and 120.

However, the invention is not limited thereto, and the line dividing the common electrode 270, the first voltage application electrode 272 and the second voltage application electrode 274 may extend in a vertical direction for example, along the top-bottom direction of FIG. 1 Where the dividing line extends in the vertical direction, a voltage may be applied to an upper edge or a lower edge of the common electrode 270, the first voltage application electrode 272 and the second voltage application electrode 274.

The common electrode 270 occupies most of the panel region PP. The common electrode 270 is an element of the completed display device such that the common electrode 270 is in most of the panel region PP after the cutting process of the first mother substrate 110 and the second mother substrate 210. A common voltage is applied to the common electrode 270 from outside the first and second mother substrates 110 and 120.

The first voltage application electrode 272 and the second voltage application electrode 274 are at the edge and/or outside of the panel region PP. The first voltage application electrode 272 and/or the second voltage application electrode 274 may be entire outside of the panel region PP, or a portion of thereof may be in the panel region PP. As illustrated in FIG. 1, for example, while a main portion of the second voltage application electrode 274 may be in the panel region PP, a protruding portion of the second voltage application electrode 274 is outside of the panel region PP to overlap the second contact electrode 114. The first voltage application electrode 272 and the second voltage application electrode 274 are used in the manufacturing process of the display device and are not an essential feature in the completed display device such that the first and second voltage application electrodes 272 and 274 are not necessary inside the panel region PP. Accordingly, when performing the cutting process of the first mother substrate 110 and the second mother substrate 210, the first voltage application electrode 272 and the second voltage application electrode 274 may be removed or separated from a remainder of the first and second mother substrates 110 and 210. A first voltage is applied to the first voltage application electrode 272 and a second voltage is applied to the second voltage application electrode 274, respectively, from outside the first and second mother substrates 110 and 210. The first voltage and the second voltage may have different values.

A second alignment layer 21 is on the second mother substrate 210. The second alignment layer 21 may cover the common electrode 270, the first voltage application electrode 272 and the second voltage application electrode 274. The second alignment layer 21 may be a vertical alignment layer, but is not limited thereto or thereby.

A first connecting member 302, a second connecting member 304 and a third connecting member 306 are between the first mother substrate 110 and the second mother substrate 210. The first connecting member 302 connects the first contact electrode 112 and the first voltage application electrode 272. The second connecting member 304 connects the second contact electrode 114 and the second voltage application electrode 274. The third connecting member 306 connects the third contact electrode 116 and the first voltage application electrode 272.

Also, a LC layer 3 is between the first mother substrate 110 and the second mother substrate 210. The LC layer 3 may include LC molecules and a reactive mesogen ("RM"). The RM is a material that is polymerized by light such as ultraviolet rays. If ultraviolet rays are irradiated in a state that an electric field is formed between the first mother substrate 110 and the second mother substrate 210 to tilt the LC molecules in a predetermined angle, a pretilt angle of the LC layer 3 is formed by the RM. That is, by irradiating the ultraviolet rays in a state that an electric field is formed between the first mother substrate 110 and the second mother substrate 210 to tilt the LC molecules in a predetermined angle, in a subsequent state in which the electric field is not applied, the LC layer 3 has the predetermined angle as the pretilt angle.

As described above, the LC layer 3 includes the RM, however the invention is not limited thereto. The LC layer 3 may only include the LC molecules, and the first alignment layer 11 and the second alignment layer 21 may include the RM. That is, the first alignment layer 11 and the second alignment layer 21 may include an alignment material including the RM. Where the first and second alignment layers 11 and 21 include the alignment material with the RM, if ultraviolet rays are irradiated in a state that an electric field is formed between the first mother substrate 110 and the second mother substrate 210 to tilt the LC molecules at a predetermined angle, a pretilt angle of the LC layer 3 is formed by the RM included in the first alignment layer 11 and the second alignment layer 21.

Next, an exemplary embodiment of a display device at one panel region of a mother substrate for a display device according to the invention will be described.

Figure 3:
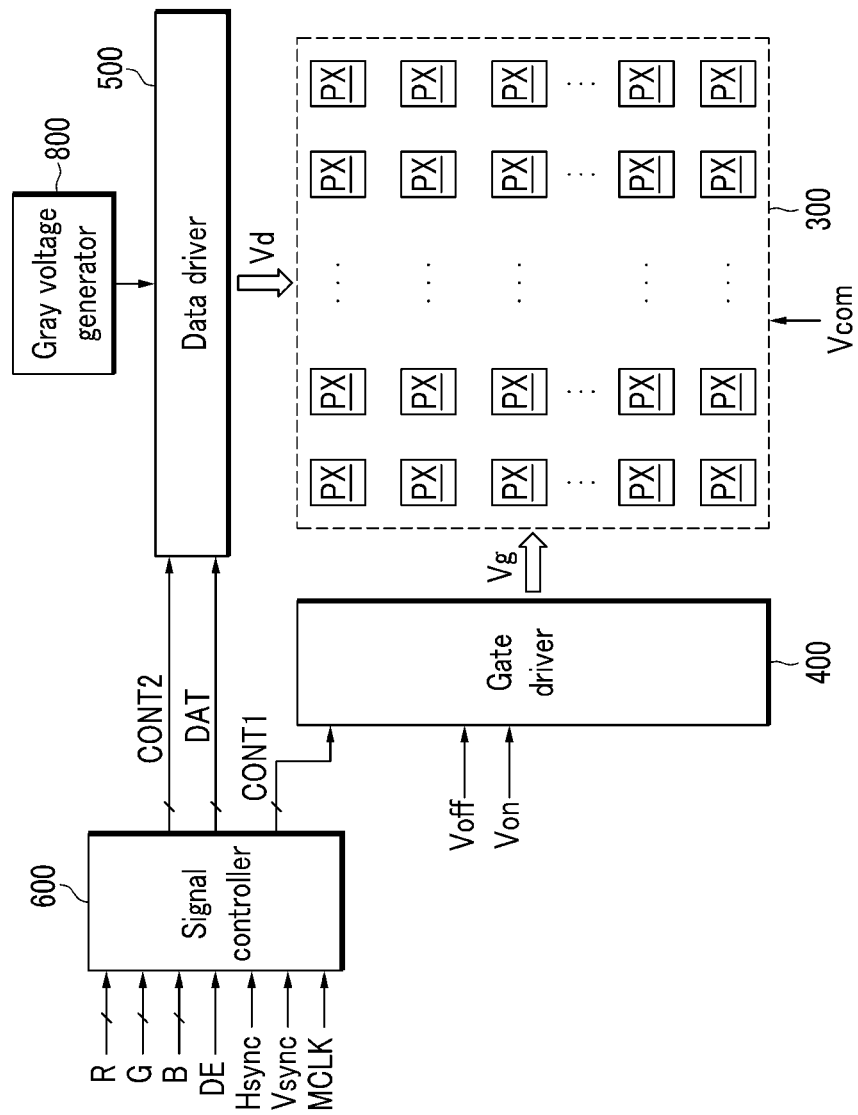
FIG. 3 is a block diagram of an exemplary embodiment of a display device at one panel region of a mother substrate for a display device according to the invention.
Figure 4:
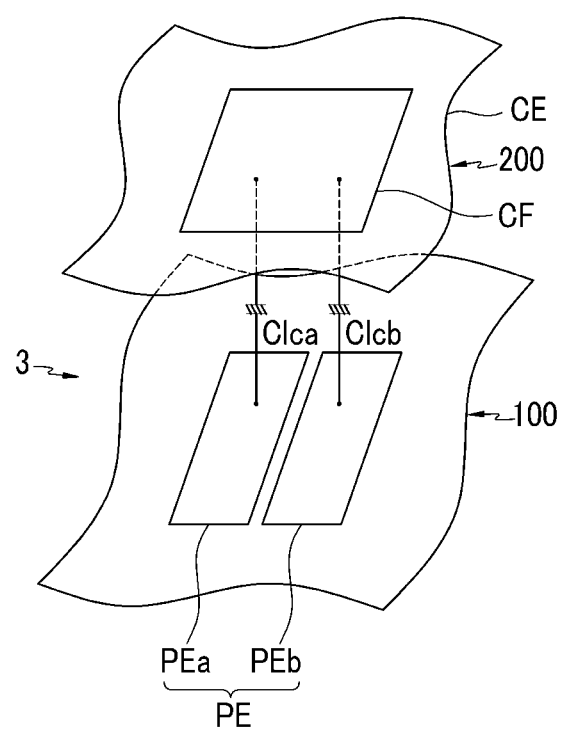
FIG. 4 is an equivalent circuit diagram of an exemplary embodiment of one pixel of the display device of FIG. 3.

FIG. 3 is a block diagram of an exemplary embodiment of a display device at one panel region of a mother substrate for a display device according to the invention, and FIG. 4 is an equivalent circuit diagram of an exemplary embodiment of one pixel of the display device of FIG. 3.

As shown in FIG. 3, an exemplary embodiment of a display device according to the invention includes a LC panel assembly 300 with a gate driver 400 and a data driver 500 connected thereto, a gray voltage generator 800 connected to the data driver 500, and a signal controller 600 controlling the gate driver 400, the data driver 500 and the gray voltage generator 800.

In an equivalent circuit, the LC panel assembly 300 includes one or more signal line (not shown), and one or more pixel PX that are connected to the one or more signal line and are arranged in an approximate matrix shape. Referring to the structure shown in FIG. 2, the LC panel assembly 300 includes the thin film transistor array display panel 100 as a lower display panel, the opposing display panel 200 as an upper display panel, and the LC layer 3 interposed therebetween.

A plurality of signal lines is provided in the lower panel 100 may include one or more gate line (not shown) that transmits a gate signal (also referred to as a "scanning signal") and one or more data line (not shown) that transmits a data signal. A plurality of gate lines extends substantially in a row direction, for example, along a left-right direction in FIG. 3, and parallel with one another. A plurality of data lines extends substantially in a column direction, for example, along a top-bottom direction in FIG. 3 and parallel with one another.

Each of a plurality of pixels PX includes a pair of sub-pixels, and each sub-pixel includes LC capacitors Clca and Clcb. A subpixel of the two sub-pixels includes a switching element (not shown) that is connected to the gate line, the data line and the LC capacitor Clca or Clcb.

The LC capacitors Clca and Clcb include first and second sub-pixel electrodes PEa and PEb of the thin film transistor array display panel 100, and a common electrode CE of the opposing display panel 200, as two terminals, respectively, and the LC layer 3 between the sub-pixel electrodes PEa and PEb, and the common electrode CE, serves as a dielectric material. The sub-pixel electrodes PEa and PEb that are separated from each other form one pixel electrode PE. The common electrode CE is on an entire surface of the opposing display panel 200, and a common voltage Vcom is applied to the common electrode CE. The LC layer 3 may have negative dielectric anisotropy.

In order to realize color display, each pixel PX uniquely displays one of primary colors (spatial division), or each pixel PX temporally and alternately displays primary colors (temporal division). The primary colors are spatially and temporally synthesized, and thus a desired color is recognized. The primary colors may include, but are not limited to, three primary colors of red, green and blue. FIG. 2 shows an example of the spatial division. In FIG. 2, each pixel PX has a color filter CF that represents one of the primary colors in a region of the opposing display panel 200. Unlike FIG. 4, in an alternative exemplary embodiment, the color filter CF may be above or below the first and the second subpixel electrode PEa or PEb of the thin film transistor array display panel 100.

A polarizer (not shown) for providing light polarization may be provided on one or more outer surface of the LC panel assembly 300.

Again referring to FIG. 3, the gray voltage generator 800 generates all gray voltages or a limited number of gray voltages (hereinafter referred to as "reference gray voltages") related to transmittance of the pixels PX. The (reference) gray voltage may be positive or negative with respect to the common voltage Vcom.

The gate driver 400 is connected to the gate line of the LC panel assembly 300, and applies a gate signal Vg which may include a combination of a gate-on voltage Von and a gate-off voltage Voff to the gate line.

The data driver 500 is connected to the data line of the LC panel assembly 300, and selects a gray voltage from the gray voltage generator 800 and applies the gray voltage as the data voltage to the data line. However, when the gray voltage generator 800 does not provide the voltage for all gray levels, but provides a predetermined number of reference gray voltages, the data driver 500 may divide the reference gray voltage to generate a gray voltage for all gray levels and then selects a data signal Vd among the generated gray voltages.

The signal controller 600 includes an image signal converter and controls the gate driver 400 and the data driver 500.

Such drivers 400, 500, 600 and 800 may be directly installed on the LC panel assembly 300 in a form of an integrated circuit ("IC") chip or installed on a flexible printed circuit film (not shown) to be attached on the LC panel assembly 300 in a form of a tape carrier package ("TCP"), or installed on a separate printed circuit board ("PCB") (not shown). Alternatively, the above-mentioned drivers 400, 500, 600 and 800 may be integrated in the LC panel assembly 300 together with the signal line and the thin film transistor switching element. Further, the drivers 400, 500, 600 and 800 may be integrated as a single chip. Where the drivers 400, 500, 600 and 800 are integrated as a single chip, a driver or a circuit element of the driver may be disposed outside the single chip.

Next, an exemplary embodiment of a display device at one panel region of a mother substrate for a display device according to the invention will be described in detail with reference to FIG. 5 and FIG. 6 as well as FIG. 1 to FIG. 4.

Figure 5:
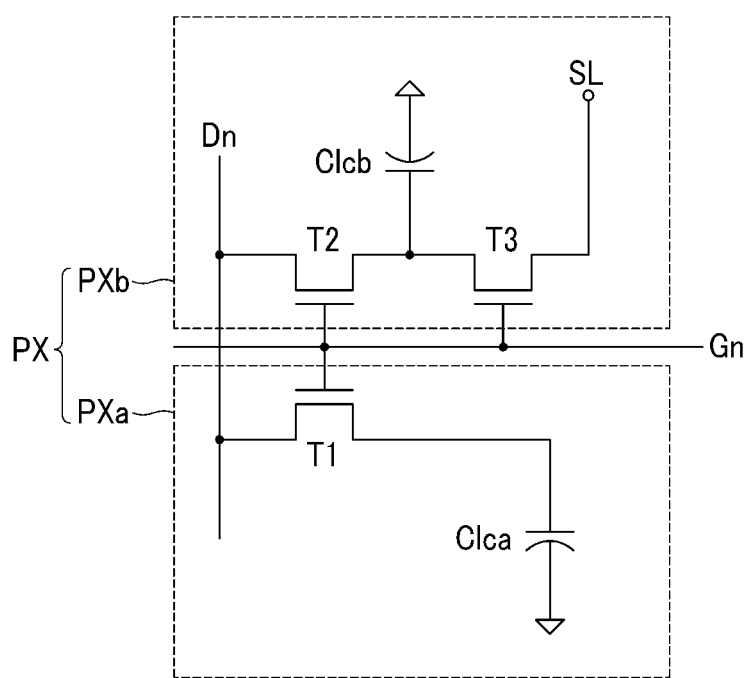
FIG. 5 is an equivalent circuit diagram of another exemplary embodiment of one pixel of a display device at one panel region of a mother substrate for a display device according to the invention.
Figure 6:
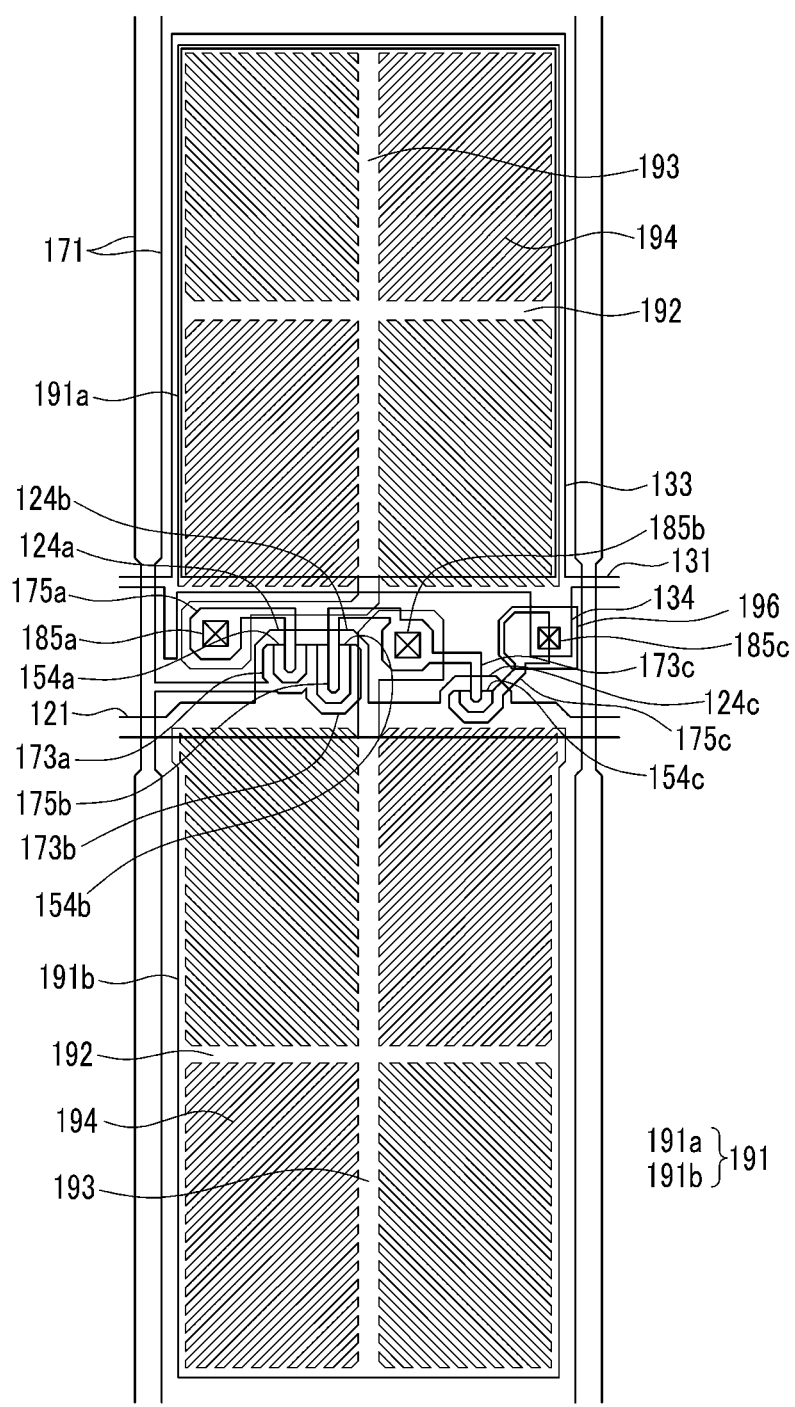
FIG. 6 is a top plan view of the one pixel shown in FIG. 5.

FIG. 5 is an equivalent circuit diagram of another exemplary embodiment of one pixel of a display device at one panel region of a mother substrate for a display device according to the invention, and FIG. 6 is a top plan view of the one pixel shown in FIG. 5.

Firstly, referring to FIG. 3 to FIG. 5, an exemplary embodiment of the display device at one panel region of the mother substrate for the display device according to the invention includes a plurality of signal lines Gn, Dn and SL and a pixel PX connected thereto. The display device may include a plurality of pixels PX.

The signal lines Gn, Dn and SL include a gate line Gn that transmits a gate signal (also referred to as a "scanning signal"), a data line Dn that transmits a data voltage, and a storage electrode line SL to which a constant voltage is applied.

The display device includes a first thin film transistor T1 and a second thin film transistor T2 connected to the same gate line Gn and the same data line Dn. Further, the display device includes a third thin film transistor T3 that is connected to the same gate line Gn as the first and second thin film transistors T1 and T2, and connected to the second thin film transistor T2 and the storage electrode line SL. The first to third thin film transistors T1, T2 and T3 may be otherwise referred to as switching elements.

The pixel PX includes two subpixels PXa and PXb. A first LC capacitor Clca that is connected to the first thin film transistor T1 is formed in the first subpixel PXa. Further, a second LC capacitor Clcb that is connected to the second thin film transistor T2 is formed in the second subpixel PXb.

A first terminal of the first thin film transistor T1 is connected to the gate line Gn, a second terminal thereof is connected to the data line Dn, and a third terminal thereof is connected to the first LC capacitor Clca. The third terminal of the first thin film transistor T1 is connected to the first subpixel electrode PEa (refer to FIG. 3) as a terminal of the first LC capacitor Clca.

A first terminal of the second thin film transistor T2 is connected to the gate line Gn, a second terminal thereof is connected to the data line Dn, and a third terminal thereof is connected to the second LC capacitor Clcb. The third terminal of the second thin film transistor T2 is connected to the second subpixel electrode PEa (refer to FIG. 3) as a terminal of the second LC capacitor Clcb.

A first terminal of the first thin film transistor T3 is connected to the gate line Gn, a second terminal thereof is connected to the storage electrode line SL, and a third terminal thereof is connected to the third terminal of the second switching element T2.

In the operation of the exemplary embodiment of the display device at one panel region of the mother substrate for the display device according to the invention, when the gate-on voltage is applied to the gate line Gn, the first to third thin film transistors T1 to T3 connected thereto are turned on, and the first LC capacitor Clca and the second LC capacitor Clcb are charged by the data voltage transmitted through the data line Dn.

At this time, since the third switching element T3 is turned on, the data voltage transmitted to the second subpixel PXb through the data line Dn is divided through the third switching element T3 coupled in series to the second switching element T2. The voltage is divided according to a size of the channels of the second switching element T2 and the third switching element T3. Accordingly, even though the data voltages that are transmitted to the first subpixel PXa and the second subpixel PXb through the data line Dn are equal to each other, the voltages that are charged in the first LC capacitor Clca and the second LC capacitor Clcb are different from each other. That is, the voltage that is charged in the second LC capacitor Clcb is lower than the voltage that is charged in the first LC capacitor Clca. By making the voltages that are charged in different subpixels PXa and PXb in the same one pixel PX different, side visibility of the display device may be improved.

Hereinafter, referring to FIG. 6, the exemplary embodiment of the one pixel of the display device at one panel region of the mother substrate for the display device according to the invention includes a gate line 121 and a storage electrode line 131 extend in one direction on the first mother substrate 110. The first mother substrate 110 may include transparent glass or plastic.

The gate line 121 has a longitudinal axis which mainly extends in a transverse direction, for example, along a left-right direction of FIG. 6, and transmits a gate signal. Further, a first gate electrode 124a and a second gate electrode 124b protrude from the first gate line 121 and are connected to each other. Also, a third gate electrode 124c protrudes from the gate line 121 and is separated from the first gate electrode 124a and the second gate electrode 124b The first to the third gate electrodes 124a, 124b and 124c are continuous with and connected to the same gate line 121 and are applied with the same gate signal.

The storage electrode line 131 has a longitudinal axis which extends in a same direction as the longitudinal axis of the gate line 121, and a constant voltage is applied to the storage electrode line 131. Also, a storage electrode 133 and a protrusion 134 protrude the storage electrode line 131. In the plan view, the storage electrode 133 may enclose a first pixel electrode 191a that will be described later, and the protrusion 134 may be protruded toward the gate line 121 from a main portion of the storage electrode line 131.

Although not shown, a gate insulating layer is on the gate line 121, the first to third gate electrodes 124a, 124b and 124c, the storage electrode line 131, the storage electrode 133 and the protrusion 134. The gate insulating layer may include an inorganic insulating material such as silicon nitride (SiNx) and silicon oxide (SiOx). Further, the gate insulating layer 140 may have a single layer or a multilayer structure.

A first semiconductor layer 154a, a second semiconductor layer 154b and a third semiconductor layer 154c are on the gate insulating layer. The first semiconductor layer 154a may be disposed on the first gate electrode 124a, the second semiconductor layer 154b may be disposed on the second gate electrode 124b and the third semiconductor layer 154c may be disposed on the third gate electrode 124c.

A data line 171, a first source electrode 173a, a first drain electrode 175a, a second source electrode 173b, a second drain electrode 175b, a third source electrode 173c and a third drain electrode 175c are on the first to third semiconductor layers 154a, 154b and 154c and the gate insulating layer.

The first to third semiconductor layers 154a, 154b and 154c may be not only on (e.g., above) the first to third gate electrodes 124a, 124b and 124c, but may also be below the data line 171, in a cross-sectional view. Further, the second semiconductor layer 154b and the third semiconductor layer 154c are continuous with and connected to each other. However, the invention is not limited thereto, and the first to third semiconductor layers 154a, 154b and 154c may only be on the first to third gate electrodes 124a, 124b and 124c. Further, the second semiconductor layer 154b and the third semiconductor layer 154c may be separated from each other.

The data line 171 transmits the data signal and has a longitudinal axis which mainly extends in a longitudinal direction, for example, along a top-bottom direction in FIG. 6, to intersect the gate line 121.

The first source electrode 173a protrudes from the data line 171 and above the first gate electrode 124a, in the plan view. The first source electrode 173a may be on or overlapping the first gate electrode 124a, and have a curved shape such as a C-shape.

The first drain electrode 175a is on or overlapping the first gate electrode 124a and spaced apart from the first source electrode 173a. A portion of the first semiconductor layer 154a that is exposed between the first source electrode 173a and the first drain electrode 175a which are spaced apart from each other, forms a channel.

The second source electrode 173b protrudes from the data line 171 and above the second gate electrode 124b, in the plan view. The second source electrode 173b may be on or overlapping the second gate electrode 124b and have a curved shape such as a C-shape.

The second drain electrode 175b is on or overlapping the second gate electrode 124b and spaced apart from the second source electrode 173b. A portion of the second semiconductor layer 154b that is exposed between the second source electrode 173b and the second drain electrode 175b which are formed to be spaced apart from each other, forms a channel.

The third source electrode 173c is continuous with and connected to the second drain electrode 175b, and is on or overlapping the third gate electrode 124c.

The third drain electrode 175c is on or overlapping the third gate electrode 124c and spaced apart from the third source electrode 173c. A portion of the third semiconductor layer 151c that is exposed between the third source electrode 173c and the third drain electrode 175c which are spaced apart from each other, forms a channel.

The above-described first gate electrode 124a, first semiconductor layer 151a, first source electrode 173a and first drain electrode 175a forms a first switching element T1. Further, the second gate electrode 124b, the second semiconductor layer 151b, the second source electrode 173b and the second drain electrode 175b forms the second switching element T2, and the third gate electrode 124c, the third semiconductor layer 151c, the third source electrode 173c and the third drain electrode 175c forms a third switching element T3.

Although not shown, a passivation layer is on the data line 171, the first to third source electrodes 173a, 173b and 173c, and the first to third drain electrodes 175a, 175b and 175c. The passivation layer may include an organic insulating material or an inorganic insulating material, and may have a single layer or a multilayer structure. In an exemplary embodiment, the organic insulating material may a color filter.

A thickness of the passivation layer defines a portion of a first contact hole 185a exposing a portion of the first drain electrode 175a, defines a portion of a second contact hole 185b exposing a portion of the second drain electrode 175b, and defines a portion of a third contact hole 185c exposing portions of the protrusion 134 and the third drain electrode 175c.

The first subpixel electrode 191a and a second subpixel electrode 191b are on the passivation layer. Also, a bridge electrode 196 is on the passivation layer. The first and second subpixel electrodes 191a and 191b may collectively form a pixel electrode 191.

The first subpixel electrode 191a is connected to the first drain electrode 175a through the first contact hole 185a, and the second subpixel electrode 191b is connected to the second drain electrode 175b through the second contact hole 185b. The bridge electrode 196 is electrically connected to the protrusion 134 and the third drain electrode 175c through the third contact hole 185c. That is, the third drain electrode 175c is connected to the storage electrode line 131.

The first subpixel electrode 191a and the second subpixel electrode 191b respectively receive the data voltage, such as a same data voltage, from the first drain electrode 175a and the second drain electrode 175b. A portion of the data voltage applied to the second drain electrode 175b is divided through the third source electrode 173c such that the voltage applied to the second subpixel electrode 191b may be smaller than the voltage applied to the first subpixel electrode 191a. When the voltage applied to the second subpixel electrode 191b is smaller than the voltage applied to the first subpixel electrode 191a, the data voltage applied to the first subpixel electrode 191a and the second subpixel electrode 191b is positive. In contrast, when the data voltage applied to the first subpixel electrode 191a and the second subpixel electrode 191b is negative, the voltage applied to the first subpixel electrode 191a may be smaller than the voltage applied to the second subpixel electrode 191b.

A planar area of the second subpixel electrode 191b may be approximately one to two times larger than that of the first subpixel electrode 191a, but is not limited thereto or thereby.

The first subpixel electrode 191a and the second subpixel electrode 191b neighbor each other in a column direction, for example, along a top-bottom direction in FIG. 6. An overall planar shape of the first and second subpixel electrodes 191a and 191b may be quadrangular. Each of the first and second subpixel electrode 191a and 191b includes a cross stem having a transverse stem 192, and a longitudinal stem 193 intersecting the transverse stem 192. Each of the first and second sub-pixel electrodes 191a and 191b are divided into four sub-regions by the transverse stem 192 and the longitudinal stem 193, and each of the sub-regions includes a plurality of minute branches 194.

A portion of the minute branches 194 of the first subpixel electrode 191a and the second subpixel electrode 191b are obliquely extended in the left upper direction from the transverse stem 192 or the longitudinal stem 193, and another portion of the minute branches 194 are obliquely extended in the right upper direction from the transverse stem 192 or the longitudinal stem 193. Also, still another portion of the minute branches 194 are extended in the left lower direction from the transverse stem 192 or the longitudinal stem 193, and yet another portion of the minute branches 194 are obliquely extended in the right lower direction from the transverse stem 192 or the longitudinal stem 193.

Each of the minute branches 194 forms an angle from about 40 degrees to 45 degrees with the gate line 121 or the transverse stem 192. In one exemplary embodiment, the minute branches 194 included in the first subpixel electrode 191a may form an angle of about 40 degrees with the transverse stem 192, and the minute branches 194 included in the second subpixel electrode 191b may form an angle of about 45 degrees with the transverse stem 192, but are not limited thereto or thereby. Also, the minute branches 194 of two neighboring sub-regions may be crossed or intersect each other in the plan view.

Next, the opposing display panel 200 will be described.

Although not shown, a light blocking member is on the second mother substrate 210. The light blocking member may otherwise be referred to a black matrix, and reduces or effectively prevents light leakage.

One or more color filter is on the second mother substrate 210 and on the light blocking member. For a plurality of color filters, most of the color filters are in the region enclosed by the light blocking member, and may have a longitudinal axis which extends according to a longitudinal axis (e.g., column) of the pixel electrode 191. Each color filter may display one of three primary colors such as red, green and blue, but the primary colors are not limited. However, the three primary colors are not limited to red, green and blue, and may display one of cyan, magenta, yellow and/or white-based colors.

In an alternative exemplary embodiment, the light blocking member or the color filter may be on the first mother substrate 110.

The second mother substrate 210 may include an overcoat (not shown) on the color filter and on the light blocking member, and the common electrode 270 that was described above may be on the overcoat.

The display device may further include a polarizer (not shown) on an outer surface of the thin film transistor array display panel 100 and/or the opposing display panel 200. Where a polarizer is on the outer surface of both the thin film transistor array display panel 100 and/or the opposing display panel 200, polarization axes of the two polarizers may be crossed, and one polarization axis thereof may be parallel to the gate line 121. In a reflective LC display device, one of the two polarizers may be omitted.

The first subpixel electrode 191a and the second subpixel electrode 191b applied with the data voltage generate an electric field together with the common electrode 270 of the opposing display panel 200 that receives the common voltage. The electric field determines a direction of LC molecules of the LC layer 3 between the subpixel electrodes 191a and 191b, and the common electrode 270. Polarization of light that transmits through the LC layer 3 differs depending on the thusly-determined direction of the LC molecules.

The first and second subpixel electrodes 191a and 191b, each respectively with the common electrode 270, form LC capacitors to maintain the applied voltage after the thin film transistor is turned off. Edges of the minute branches 194 of the first and second subpixel electrodes 191a and 191b make a horizontal component of the electric field perpendicular to the edges of the minute branches 194, and an inclination direction of LC molecules is determined in the direction determined by the horizontal component. Here, the LC molecules initially tend to incline in a direction perpendicular to the edge of the minute branches 194. However, the directions of the horizontal components of the electric field near the edge of the neighboring minute branches 194 are opposite. Therefore, an interval between the minute branches 194 is very narrow such that the LC molecules that tend to incline in the opposite direction to each other are tilted in the direction parallel to a longitudinal axis (e.g., length direction) of the minute branches 194.

In an exemplary embodiment of the invention, the length directions in which the minute branches 194 of one pixel extend are four directions such that the inclined directions of the LC molecules are four directions. Therefore, the reference viewing angle of the LC display is widened by varying the inclined directions of the LC molecules.

Next, an exemplary embodiment of a manufacturing method of a mother substrate for a display device according to the invention will be described with reference to FIG. 1 to FIG. 7.

Figure 7:
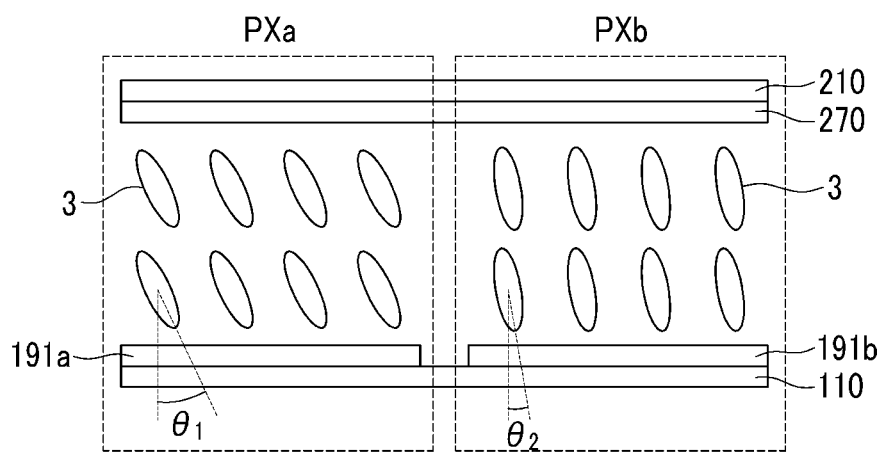
FIG. 7 is a view of an exemplary embodiment of a pretilt of a liquid crystal layer of a mother substrate for a display device according to the invention.

FIG. 7 is a view of an exemplary embodiment of a pretilt of a LC layer of a mother substrate for a display device according to the invention.

Firstly, the pixel structure shown in FIG. 4 and FIG. 5 is formed (e.g., provided) on the first mother substrate 110. That is, the gate line Gn and the storage electrode line SL are formed, and the data line Dn is further formed on the first mother substrate 110. The first switching element T1 and the second switching element T2 connected to the gate line Gn and the data line Dn are formed, and the third switching element T3 connected to the gate line Gn, the second switching element T2 and storage electrode line SL is formed. Also, the first subpixel electrode PEa connected to the first switching element T1 and the second subpixel electrode PEb connected to the second switching element T2 are formed. The shapes and structure of these elements may be referenced to the description for FIG. 6 such that the description thereof is omitted.

Also, the first contact electrode 112, the second contact electrode 114 and the third contact electrode 116 are formed on the first mother substrate 110.

The first contact electrode 112 is formed to be connected to the data line 171. A plurality of data lines 171 may be formed in each panel region PP, and the first contact electrode 112 is connected to the plurality of data lines 171. Accordingly, the voltage applied to the first contact electrode 112 is transmitted to each data line 171 of the plurality of data lines 171. The first contact electrode 112 may be formed in the same layer of the first mother substrate 110 and by a same material as the data line 171, thereby being directly connected to the data line 171. Alternatively, the first contact electrode 112 and the data line 171 may be connected through a different connection.

The second contact electrode 114 is formed to be connected to the storage electrode line 131. A plurality of storage electrode lines 131 may be formed in each panel region PP, and the second contact electrode 114 is connected to the plurality of storage electrode lines 131. Accordingly, the voltage applied to the second contact electrode 114 is transmitted to each storage electrode line 131 of the plurality of storage electrode lines 131. The second contact electrode 114 may be formed in a same layer of the first mother substrate 110 and by a same material as the storage electrode line 131, thereby being directly connected to the storage electrode line 131. Alternatively, the second contact electrode 114 and the storage electrode line 131 may be connected through a different connection.

The third contact electrode 116 is formed to be connected to the gate line 121. A plurality of gate lines 121 may be formed in each panel region PP, and the third contact electrode 116 is connected to the plurality of gate lines 121. Accordingly, the voltage applied to the third contact electrode 116 is transmitted to each gate line 121 of the plurality of gate lines 121. The third contact electrode 116 may be formed in a same layer of the first mother substrate 110 and by a same material as the gate line 121 thereby being directly connected to the gate line 121. Alternatively, the third contact electrode 116 and the gate line 121 may be connected through a different connection.

A first alignment layer 11 is formed on an entire surface of the first mother substrate 110.

A metal material is deposited on the second mother substrate 210 to form a voltage application electrode 276. The voltage application electrode 276 may include a transparent material such as ITO and IZO.

The voltage application electrode 276 is divided into a plurality of regions through a laser trimming process. As the plurality of regions, the common electrode 270, the first voltage application electrode 272 and the second voltage application electrode 274 are formed, respectively. In the laser trimming process, a laser is irradiated according to a boundary of the common electrode 270 and the second voltage application electrode 274 shown in FIG. 1 such that the common electrode 270 and the second voltage application electrode 274 are electrically separated. Also, the laser is irradiated according to a boundary of the first voltage application electrode 272 and the second voltage application electrode 274 such that the first voltage application electrode 272 and the second voltage application electrode 274 are electrically separated.

A second alignment layer 21 is formed on an entire surface of the second mother substrate 210.

The first mother substrate 110 and the second mother substrate 210 are combined, and the LC molecules and the RM are injected together between the first mother substrate 110 and the second mother substrate 210 to form the LC layer 3. Alternatively, the LC molecule and the RM may be dripped together on the first mother substrate 110 or the second mother substrate 210 to form the LC layer 3 and then the first mother substrate 110 and the second mother substrate 210 may be combined.

In the state that the first mother substrate 110 and the second mother substrate 210 are combined, the first contact electrode 112 and the third contact electrode 116 overlap the first voltage application electrode 272. Also, the second contact electrode 114 overlaps the second voltage application electrode 274.

The first contact electrode 112 and the first voltage application electrode 272 are connected, and the second contact electrode 114 and the second voltage application electrode 274 are connected. Also, the third contact electrode 116 and the first voltage application electrode 272 are connected. Each connection process may use a soldering process or a laser shorting process. By the connection process, the first connecting member 302 connecting the first contact electrode 112 and the first voltage application electrode 272, the second connecting member 304 connecting the second contact electrode 114 and the second voltage application electrode 274, and the third connecting member 306 connecting the third contact electrode 116 and the first voltage application electrode 272, are formed. The first alignment layer 11 may be partially opened for the first connecting member 302, the second connecting member 304 and the third connecting member 306 to be respectively connected to the first contact electrode 112, the second contact electrode 114 and the third contact electrode 116. Also, the second alignment layer 21 may be partially opened for the first connecting member 302, the second connecting member 304 and the third connecting member 306 to be respectively connected to the first voltage application electrode 272 and the second voltage application electrode 274.

The common voltage is applied to the common electrode 270, the first voltage is applied to the first voltage application electrode 272 and the second voltage is applied to the second voltage application electrode 274. The first voltage applied to the first voltage application electrode 272 is transmitted to the first contact electrode 112 through the first connecting member 302, and is transmitted to the third contact electrode 116 through the third connecting member 306. The third contact electrode 116 is connected to the gate line 121 such that the first voltage is transmitted to the gate line 121. The first contact electrode 112 is connected to the data line 171 such that the first voltage is applied to the data line 171.

The first voltage is applied to the gate line 121 such that the first to third switching elements T1, T2 and T3 are turned on, and the first voltage is applied to the data line 171 such that the first voltage is transmitted to the first subpixel electrode 191a. The first voltage is transmitted to the second subpixel electrode 191b. However the second voltage is applied to the storage electrode line 131 such that the voltage division is generated.

Resultantly, the LC layer 3 positioned between the first subpixel electrode 191a and the common electrode 270, that is, the voltage between two ends of (e.g., across a cross-section of) the LC layer 3 positioned at the first subpixel PXa is determined according to the common voltage and the first voltage according to Equation 1.

$$V_H = |Vcom - Vdata| \quad \text{Equation 1}$$

($V_H$: the voltage between two ends of the LC layer of the first subpixel, Vcom: the common voltage, Vdata: the first voltage)

By forming an electric field at two sides of the LC layer 3 of the first subpixel PXa, the LC molecules are inclined in a predetermined angle with regard to a direction perpendicular to the first mother substrate 110 and the second mother substrate 210, and this angle is referred to as the first pretilt angle θ1.

Also, the LC layer 3 positioned between the second subpixel electrode 191b and the common electrode 270, that is, the voltage between two ends of the LC layer 3 positioned at the second subpixel PXb, is determined according to the common voltage, a resistance of the third switching element, a resistance of the second switching element, the first voltage and the second voltage.

$$V_L = \left| Vcom - \left( \frac{R_{RD}}{R_{Low} + R_{RD}} (Vdata - Vcst) + Vcst \right) \right| \quad \text{Equation 2}$$

($V_L$: the voltage between two ends of the LC layer of the second subpixel, Vcom: the common voltage, $R_{RD}$: the resistance of the third switching element, $R_{LOW}$: the resistance of the second switching element, Vdata: the first voltage, Vcst: the second voltage)

By forming an electric field at two sides of the LC layer 3 of the second subpixel PXb, the LC molecules are inclined in a predetermined angle with regard to a direction perpendicular to the first mother substrate 110 and the second mother substrate 210, and this angle is referred to as the second pretilt angle θ2.

In one exemplary embodiment, the first voltage and the second voltage have different values. When the first voltage and the second voltage have the different values, the voltages between two ends of the LC layer 3 in the first subpixel PXa and the second subpixel PXb are different from each other. Accordingly, the first pretilt angle θ1 and the second pretilt angle θ2 have the different values, thereby improving the visibility.

As described, the gate line 121 and the data line 171 are applied with the same first voltage. However, the invention is not limited thereto. Alternatively, where an electrode that is separated from the first voltage application electrode 272 is connected to the third contact electrode 116, the gate line 121 and the data line 171 may be applied with the different voltages.

While and/or after the electric field is formed at two sides of the LC layer 3 of the first and second subpixels PXa and PXb, ultraviolet rays are irradiated to the first mother substrate 110 or the second mother substrate 210. By the irradiation of the ultraviolet rays, the RM included in the LC layer 3 is reacted such that an initial alignment state of the LC layer 3 may be maintained when the electric field is removed or not formed.

The LC layer 3 includes the RM, however, the invention is not limited thereto. The LC layer 3 may include only the LC molecules, and the first alignment layer 11 or the second alignment layer 21 may include the RM. That is, in the process of forming the first alignment layer 11 and the second alignment layer 21, an alignment material including the RM may be used. Where the first and second alignment layers 11 and 21 include the alignment material with the RM, if the electric field is formed between the first mother substrate 110 and the second mother substrate 210, and ultraviolet rays are irradiated in a state that the electric field is formed between the first mother substrate 110 and the second mother substrate 210 to tilt the LC molecules of the LC layer 3 at a predetermined angle, the RM included in the first alignment layer 11 and the second alignment layer 21 is reacted such that the pretilt angle of the LC layer 3 is formed.

After the first and second mother substrates 110 and 210 for the display device is formed by the above process, the first mother substrate 110 and the second mother substrate 210 are cut to separate the panel regions PP such that one display device is formed for each panel region PP.

Hereinafter, a relation of the first voltage and the second voltage is described with reference to FIG. 7 and FIG. 8.

Figure 8:
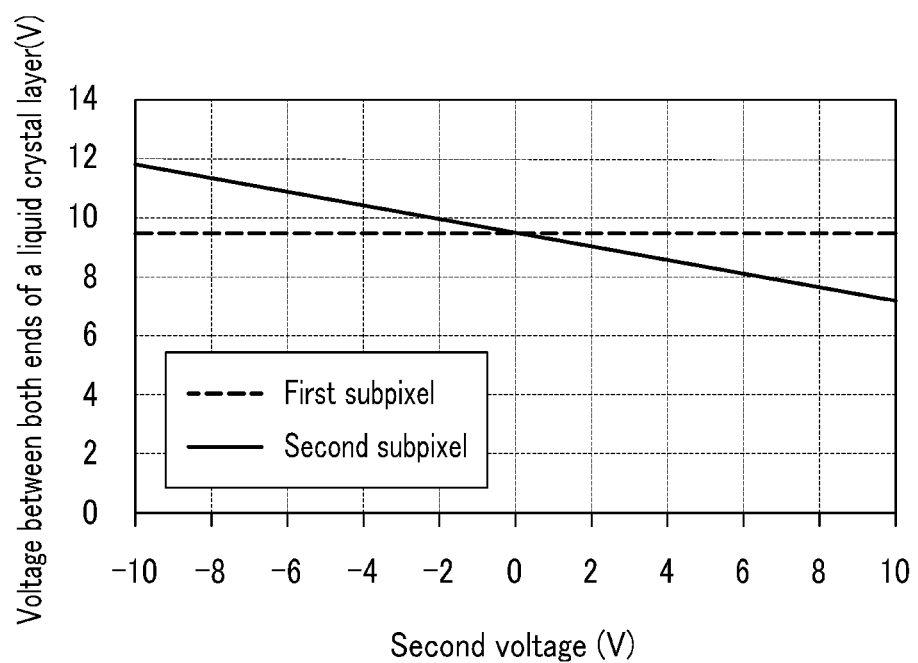
FIG. 8 is a graph showing a voltage in volts (V) between both ends of a liquid crystal layer when a first voltage is 0 V, a common voltage is 9.5 V and a second voltage has a value from −10 V to 10 V.

FIG. 8 is a graph showing a voltage in volts (V) between both ends of a LC layer when the first voltage is 0 V, a common voltage is 9.5 V, and the second voltage has a value from −10 V to 10 V.

When the second voltage is 0 V, the voltage between two terminals of the LC layer of the first subpixel PXa is 9.5 V, and the voltage between two terminals of the LC layer of the second subpixel PXb is also 9.5 V.

When the second voltage is lower than 0 V, that is, the second voltage is lower than the first voltage, the voltage between two ends of the LC layer of the second subpixel PXb is higher than the voltage between two ends of the LC layer of the first subpixel PXa. Accordingly, the second pretilt angle θ2 has the higher value than the first pretilt angle θ1, and thereby an aspect of the response speed is advantageous.

When the second voltage is higher than 0 V, that is, the second voltage is higher than the first voltage, the voltage between two ends of the LC layer of the second subpixel PXb is lower than the voltage between two ends of the LC layer of the first subpixel PXa. Accordingly, the second pretilt angle θ2 is lower than the first pretilt angle θ1, and thereby an aspect of the visibility is further advantageous.

The first voltage and the second voltage may be controlled according to whether the response speed is to be further improved or the visibility is to be further improved. When further considering the response speed, the second voltage may be set to be lower than the first voltage, while when further considering the visibility, the second voltage may be set to be higher than the first voltage.

The described relation in FIG. 7 of the first voltage and the second voltage is limited to the case that the first voltage is lower than the common voltage. In contrast, when the first voltage is higher than the common voltage, the relation of the first voltage and the second voltage is reversed. That is, when the first voltage is higher than the common voltage, if the second voltage is set to be lower than the first voltage, the visibility is further advantageous, while if the second voltage is set to be higher than the first voltage, the response speed is further advantageous.

Next, the visibility of a mother substrate for a display device according to the invention will be described with reference to FIG. 9 to FIG. 11.

Figure 9:
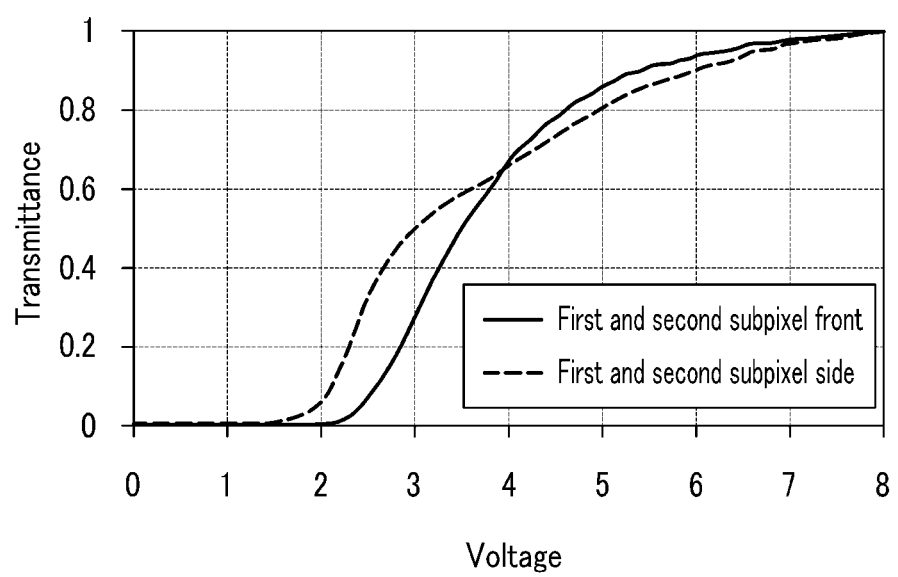
FIG. 9 is a graph of a voltage-transmittance curve of a mother substrate for a display device according to a Comparative example.
Figure 10:
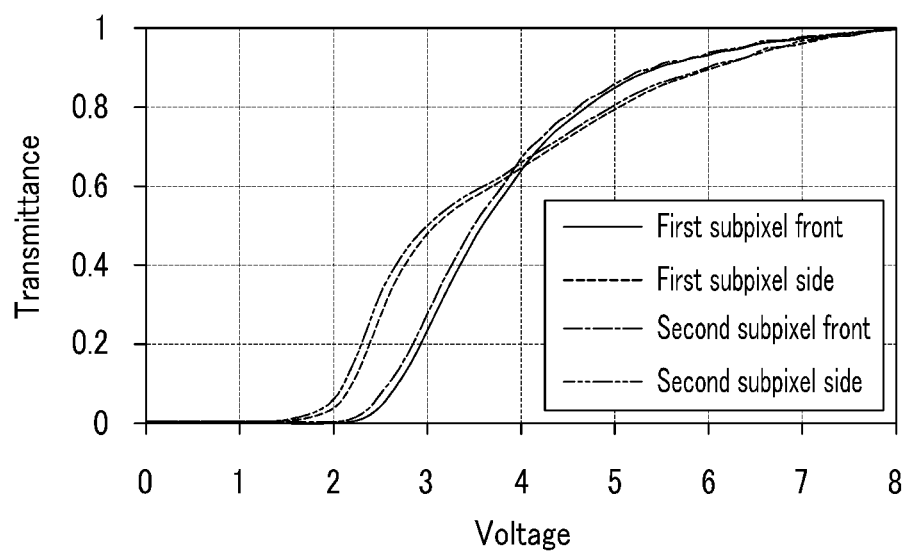
FIG. 10 is a graph of a voltage-transmittance curve of an exemplary embodiment of a mother substrate for a display device according to the invention.
Figure 11:
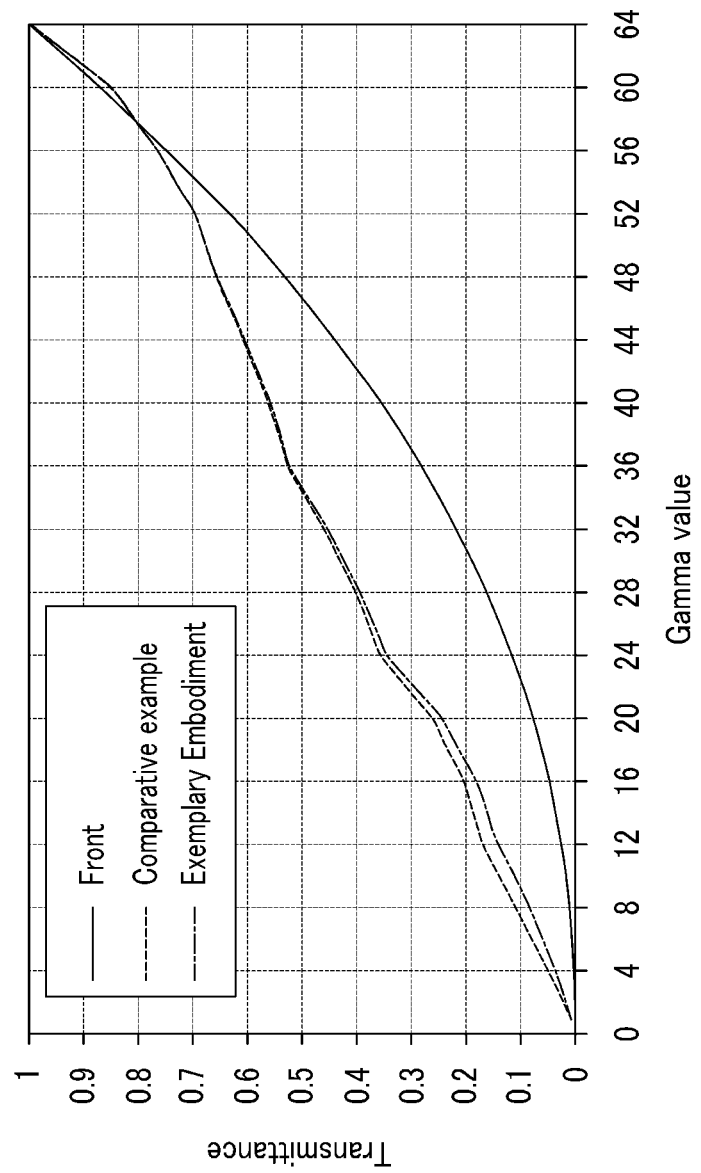
FIG. 11 is a graph of gamma curves of an exemplary embodiment of a mother substrate for a display device according to the invention and a mother substrate for a display device according to a Comparative example.

FIG. 9 is a graph of a voltage-transmittance curve of a mother substrate for a display device according to a Comparative example, FIG. 10 is a graph of a voltage-transmittance curve of an exemplary embodiment of a mother substrate for a display device according to the invention, and FIG. 11 is a graph of a gamma curve of an exemplary embodiment of a mother substrate for a display device according to the invention and a mother substrate for a display device according to a Comparative example. FIG. 10 and FIG. 11 as simulation results are views to explain an effective aspect of the invention, however a slightly different result may appear in an actual invention.

In a Comparative example shown in FIG. 9, the second voltage is not separately applied (e.g., is not different than that first voltage), and the pretilt angle of the LC layer is formed by only using the common voltage and the first voltage. When the second voltage is not separately applied, the storage electrode line voltage is not applied such that the same electric field is formed in the first subpixel and the second subpixel. Accordingly, the LC layer of the first subpixel and the LC layer of the second subpixel have the same pretilt angle.

Where the LC layer of the first subpixel and the LC layer of the second subpixel have the same pretilt angle, a voltage-transmittance curve at the front surface of the first subpixel is the same as the voltage-transmittance curve at the front surface of the second subpixel. Also, a voltage-transmittance curve at the lateral (e.g., side) surface of the first subpixel is the same as the voltage-transmittance curve at the lateral surface of the second subpixel.

In an exemplary embodiment of the invention shown in FIG. 10, the second voltage is separately applied such that the different electric fields are formed in the first subpixel and the second subpixel. Accordingly, the LC layer of the first subpixel and the LC layer of the second subpixel have the different pretilt angles.

Where the LC layer of the first subpixel and the LC layer of the second subpixel have the different pretilt angles, a voltage-transmittance curve at the front surface of the first subpixel is different from the voltage-transmittance curve at the front surface of the second subpixel. Also, a voltage-transmittance curve at the lateral surface of the first subpixel is different from the voltage-transmittance curve at the lateral surface of the second subpixel.

Accordingly, the exemplary embodiment of the mother substrate for the display device according to the invention represented in FIG. 10 has the effect of the improved visibility compared with the Comparative example represented in FIG. 9. This improved effect of the visibility may be seen referring to FIG. 11. As shown in FIG. 11, the lateral gamma curve representing the exemplary embodiment of the mother substrate for the display device according to the invention may be closer to an actual front gamma curve compared to the lateral gamma curve of the Comparative example.

Next, a response speed characteristic of a mother substrate for a display device according to an exemplary embodiment of the invention will be described with reference to FIG. 12.

Figure 12:
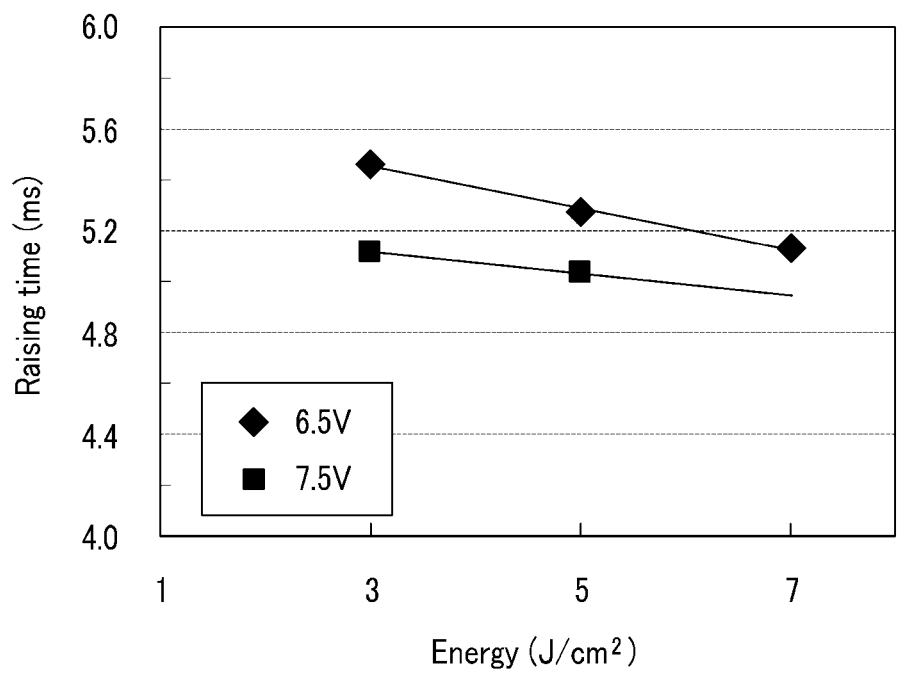
FIG. 12 is a graph of a raising time in milliseconds (ms) of a liquid crystal molecule according to a voltage in volts (V) between both ends of a liquid crystal layer.

FIG. 12 is a graph of a raising time of a LC molecule according to a voltage between both ends of a LC layer.

In FIG. 12, the horizontal axis represents energy in joules per square centimeter ($J/cm^2$) in the ultraviolet ray irradiation process, and the vertical axis represents a raising time in milliseconds (ms) of the LC molecule. When the raising time of a LC molecule is short, the LC quickly reacts such that the response speed of the LC molecule is fast. When the ultraviolet ray irradiation energy is high, the raising time of the LC molecule is short such that the response speed of the LC molecule is fast.

Also, when the voltage between both ends of the LC layer is 7.5 V, the raising time is short compared with 6.5 V. That is, as the voltage between both ends of the LC layer is increased, the response speed of the LC is faster.

The second subpixel has a lower electric field than the first subpixel when actually driving the display device such that the response speed of the LC is relatively low. By considering this, when increasing the voltage between both ends of the LC layer of the second subpixel rather than the voltage between both ends of the LC layer of the first subpixel, the response speed of the LC molecules of an overall display device may be further improved. That is, as described above, when considering the response speed, the second voltage is set lower than the first voltage such that the voltage between both ends of the LC layer of the second subpixel may be increased.

Next, a mother substrate for a display device according to another exemplary embodiment of the invention will be described with reference to FIG. 1, FIG. 2, FIG. 13, and FIG. 14.

Figure 13:
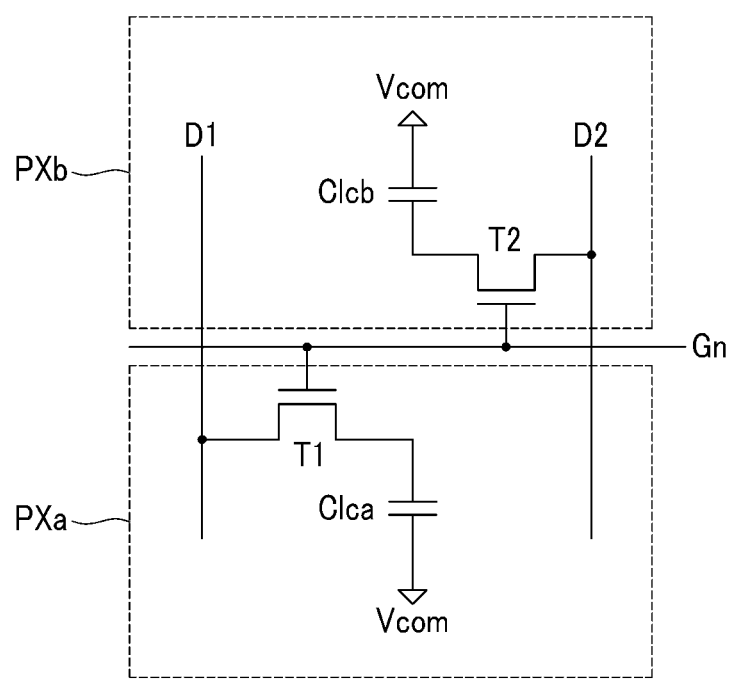
FIG. 13 is an equivalent circuit diagram of still another exemplary embodiment of one pixel of a display device at one panel region of a mother substrate for a display device according to the invention.
Figure 14:
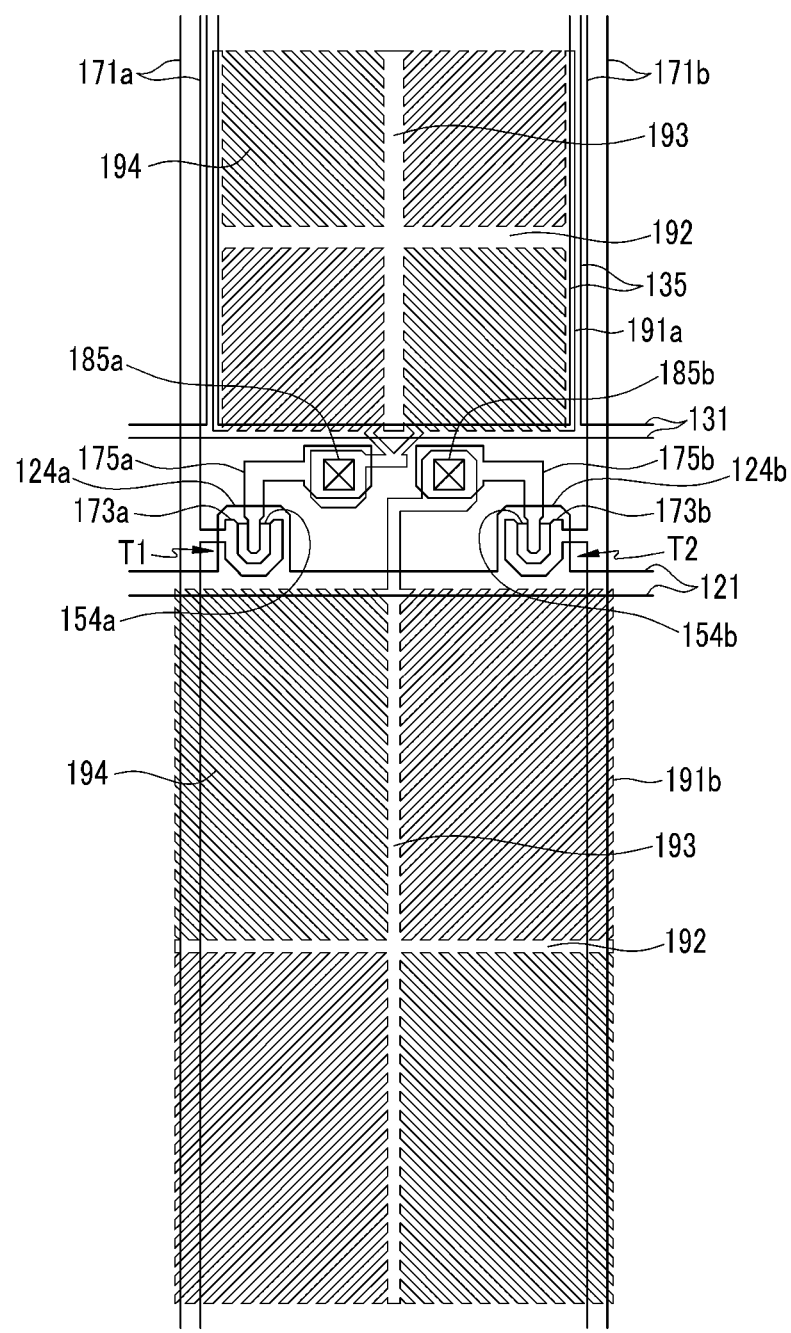
FIG. 14 is a top plan view of the one pixel shown in FIG. 13.

FIG. 13 is an equivalent circuit diagram of still another exemplary embodiment of one pixel of a display device at one panel region of a mother substrate for a display device according to the invention, and FIG. 14 is a top plan view of the one pixel shown in FIG. 13.

The mother substrate for a display device according to the invention represented in FIG. 13 and FIG. 14 is the same as the exemplary embodiment represented in FIG. 5 and FIG. 6 such that the description thereof is omitted and only differences will be described. The largest difference of the exemplary embodiment in FIG. 13 and FIG. 14 from the exemplary embodiment in FIG. 5 and FIG. 6 is the pixel structure, and such difference is described in detail hereafter.

Another exemplary embodiment of mother substrate for a display device according to the invention includes the first mother substrate 110 and the second mother substrate 210 facing and combined to each other. The first contact electrode 112, the second contact electrode 114 and the third contact electrode 116 are on the first mother substrate 110, where the common electrode 270, the first voltage application electrode 272 and the second voltage application electrode 274 are on the second mother substrate 210.

The LC layer 3, the first connecting member 302, the second connecting member 304 and the third connecting member 306 are is between the first mother substrate 110 and the second mother substrate 210.

Next, referring to FIG. 13, another exemplary embodiment of a display device at one panel region of the mother substrate for the display device according to another exemplary embodiment of the invention will be described.

The another exemplary embodiment of the display device in one panel region of the mother substrate for the display device according to the invention includes the gate line Gn transmitting the gate signal, the first data line D1 transmitting the first data voltage and the second data line D2 transmitting the second data voltage.

The first switching element T1 is connected to the gate line Gn and the first data line D1, and the second switching element T2 is connected to the gate line Gn and the second data line D2. The first switching element T1 and the second switching element T2 are connected to the same gate line Gn.

The first LC capacitor Clca connected to the first switching element T1 is in the first subpixel PXa, and the second LC capacitor Clcb connected to the second switching element T2 is in the second subpixel PXb.

The first terminal of the first thin film transistor T1 is connected to the gate line Gn, the second terminal thereof is connected to the first line D1, and the third terminal thereof is connected to the first LC capacitor Clca.

The first terminal of the second thin film transistor T2 is connected to the gate line Gn, the second terminal thereof is connected to the second data line D2, and the third terminal thereof is connected to the second LC capacitor Clcb.

If the gate line Gn is applied with the gate-on voltage, the first switching element T1 and the second switching element T2 connected thereto are turned on. The first data line D1 and the second data line D2 are applied with the different voltages such that the first LC capacitor Clca and the second LC capacitor Clcb are charged with the different voltages when the first switching element T1 and the second switching element T2 are turned on. Accordingly, by differentiating the voltages charged to the first subpixel PXa and the second subpixel PXb, the lateral visibility of the display device may be improved.

The exemplary embodiment the one pixel of the display device in one panel region of the mother substrate for the display device according to the invention will be described with reference to FIG. 14.

The gate line 121 and the storage electrode line 131 each have a longitudinal axis which extends a first direction (e.g., transverse or left-right direction in FIG. 14) on the first mother substrate 110. The first gate electrode 124a and the second gate electrode 124b are protruded from the gate line 121. A storage electrode 135 is protruded from the storage electrode line 131. The storage electrode line 131 and the storage electrode 135 may function as a shielding electrode in a structure using an organic layer under the pixel electrode 191.

The shape and the arrangement of the storage electrode line 131 and the storage electrode 135 may be variously changed in alternative exemplary embodiments.

Although not shown, a gate insulating layer such as including silicon nitride (SiNx) or silicon oxide (SiOx) is on the gate line 121, the first gate electrode 124a, the second gate electrode 124b, the storage electrode line 131 and the storage electrode 135.

A plurality of the first and second semiconductors 154a and 154b including hydrogenated amorphous silicon (amorphous silicon is commonly abbreviated to "a-Si"), polysilicon, or the like are on the gate insulating layer. The first semiconductor 154a overlaps the first gate electrode 124a, and the second semiconductor 154b overlaps the second gate electrode 124b.

First and second data lines 171a and 171b each have a longitudinal axis which extends in a second direction (e.g., longitudinal or top-bottom direction in FIG. 14) on the gate insulating layer. The gate line 121 may intersect the first and second data lines 171a and 171b. The first mother substrate 110 may include a plurality of pixels disposed in a matrix shape thereon. That is, the matrix of pixels may include a plurality of pixel columns and a plurality of pixel rows. The first data line 171a is disposed at a left edge of each pixel column, and the second data line 171b is disposed at a right edge of each pixel column.

The first source electrode 173a protruded from the first data line 171a and on the first gate electrode 124a, and the first drain electrode 175a separated from the first source electrode 173a, are on the gate insulating layer. The second source electrode 173b protruded from the second data line 171b and on the second gate electrode 124b, and the second drain electrode 175b separated from the second source electrode 173b, are on the gate insulating layer. The first source electrode 173a and the second source electrode 173b may have a U-shape in the plan view. The first and second drain electrodes 175a and 175b each extend from a first end that is narrow with a substantially uniform width and partially surrounded by the first and second source electrodes 173a and 173b, to an opposing second end with is relatively wide compared to the first end.

The first gate electrode 124a, the first source electrode 173a and the first drain electrode 175a form the first switching element T1 together with the first semiconductor 154a. The second gate electrode 124b, the second source electrode 173b and the second drain electrode 175b form the second switching element T2 together with the second semiconductor 154b. A portion of the first and second semiconductors 154a and 154b which are between the first and second source electrodes 173a and 173b, and the first and second drain electrodes 175a and 175b, respectively, form channels of the first and second switching elements T1 and T2.

Although not shown, a passivation layer is on the gate line 121, the first and second data lines 171a and 171b, and the first and second switching elements T1 and T2. The passivation layer includes the first contact hole 185a exposing a portion of the first drain electrode 175a, and the second contact hole 185b exposing a portion of the second drain electrode 175b.

The first subpixel electrode 191a is connected through the first contact hole 185a to the first drain electrode 175a, and the second subpixel electrode 191b is connected through the second contact hole 185b to the second drain electrode 175b. The first subpixel electrode 191a is connected to the first switching element T1, and the second subpixel electrode 191b is connected to the second switching element T2. The first subpixel electrode 191a and the second subpixel electrode 191b are in one pixel, and may be separated from each other with the gate line 121 interposed therebetween. The first and second subpixel electrodes 191a and 191b may include a transparent conductive material such as ITO or IZO, or a reflective metal such as aluminum, silver, chromium or an alloy thereof.

A planar area of the first subpixel electrode 191a may be smaller than a planar area of the second subpixel electrode 191b.

The first subpixel electrode 191a and the second subpixel electrode 191b neighbor each other in the column direction, and an overall shape thereof is quadrangular. Each of the first and second subpixel electrode 191a and 191b includes a cross stem having a transverse stem 192 and a longitudinal stem 193 intersecting thereto. The first and second sub-pixel electrodes 191a and 191b are divided into four sub-regions by the transverse stem 192 and the longitudinal stem 193, and each of the sub-regions includes a plurality of minute branches 194.

A portion of the minute branches 194 of the first subpixel electrode 191a and the second subpixel electrode 191b are obliquely extended in the left upper direction from the transverse stem 192 or the longitudinal stem 193, and another portion of the minute branches 194 are obliquely extended in the right upper direction from the transverse stem 192 or the longitudinal stem 193. Also, still another portion of the minute branches 194 are extended in the left lower direction from the transverse stem 192 or the longitudinal stem 193, and yet another portion of the minute branches 194 are obliquely extended in the right lower direction from the transverse stem 192 or the longitudinal stem 193.

Each of the minute branches 194 forms an angle from about 40 degrees to 45 degrees with the gate line 121 or the transverse stem 192. In one exemplary embodiment, the minute branches 194 included in the first subpixel electrode 191a may form an angle of about 40 degrees with the transverse stem 192, and the minute branches 194 included in the second subpixel electrode 191b may form an angle of about 45 degrees with the transverse stem 192, but are not limited thereto or thereby. Also, the minute branches 194 of two neighboring subregions may be crossed or intersect each other in the plan view.

The first and second subpixel electrodes 191a and 191b receive the data voltage from the first and second data lines 171a and 171b when the first and the second switching elements T1 and T2 are turned on.

In the another exemplary embodiment of the mother substrate for the display device according to the invention, referring to FIG. 2 and FIG. 14, the first contact electrode 112 is connected to the first data line 171a and the second contact electrode 114 is connected to the second data line 171b. The third contact electrode 116 may be connected to the gate line 121.

Again referring to FIG. 2 and FIG. 14, where the common electrode 270 is applied with the common voltage, the first voltage application electrode 272 is applied with the first voltage and the second voltage application electrode 274 is applied with the second voltage, the first data line 171a is applied with the first voltage, and the second data line 171b is applied with the second voltage.

In one exemplary embodiment, the first voltage and the second voltage have different values, but the invention is not limited thereto or thereby. By applying the different values to the first data line 171a and the second data line 171b, the first subpixel electrode 191a and the second subpixel electrode 191b are applied with the different voltages, respectively. Accordingly, the voltage between both ends of the LC layer 3 positioned between the first subpixel electrode 191a and the common electrode 270, is different from the voltage between both ends of the LC layer 3 positioned between the second subpixel electrode 191b and the common electrode 270.

By irradiating ultraviolet rays in the state that the voltage between both ends of the LC layer 3 of the first subpixel PXa is different from the voltage between both ends of the LC layer 3 of the second subpixel PXb, the pretilt angle of the LC layer 3 of the first subpixel PXa may be different from the pretilt angle of the LC layer 3 of the second subpixel PXb.

Like the previous exemplary embodiment, the LC layer 3 may include the RM, and the first and second alignment layers 11 and 21 may include the RM.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mother substrate for a display device comprising:
a first substrate and a second substrate each comprising a panel region comprising the display device, and facing each other;
the first substrate facing the second substrate, further comprising:
a first contact electrode, a second contact electrode and a third contact electrode each outside the panel region of the first substrate,
a gate line, a data line and a storage electrode line,
a first switching element, a second switching element and a third switching element each connected to a same gate line and a same data line,
the third switching element connected to the same gate line, the second switching element and the storage electrode line,
a first subpixel electrode connected to the first switching element, and
a second subpixel electrode connected to the second switching element;

the second substrate facing the first substrate, further comprising:
a common electrode, and
a first voltage application electrode and a second voltage application electrode separated from each other and each outside the panel region of the second substrate; and
a liquid crystal layer between the first substrate and the second substrate facing each other,
wherein among the first and second substrates facing each other,
the first voltage application electrode of the second substrate is connected to the first contact electrode and the third contact electrode of the first substrate,
the second voltage application electrode of the second substrate is connected to the second contact electrode of the first substrate,
the first voltage application electrode connected to the first contact electrode of the first substrate is applied with a first voltage, and the second voltage application electrode connected to the second contact electrode of the first substrate is applied with a second voltage different from the first voltage,
the first contact electrode is connected to the same data line,
the second contact electrode is connected to the storage electrode line, and
the third contact electrode is connected to the same gate line to which the first to third switching elements are connected.

2. The mother substrate of claim 1, wherein
the first switching element comprises a first terminal connected to the same gate line, a second terminal connected to the same data line, and a third terminal connected to the first subpixel electrode,
the second switching element comprises a first terminal connected to the same gate line, a second terminal connected to the same data line, and a third terminal connected to the second subpixel electrode, and
the third switching element comprises a first terminal connected to the same gate line, a second terminal connected to the storage electrode line, and a third terminal connected to the third terminal of the second switching element.

3. The mother substrate of claim 1, wherein the first voltage is higher than the second voltage.

4. The mother substrate of claim 1, wherein the first voltage is lower than the second voltage.

5. The mother substrate of claim 1, wherein
the liquid crystal layer comprises a liquid crystal molecule and a reactive mesogen.

6. The mother substrate of claim 1, further comprising:
a first alignment layer on the first substrate; and
a second alignment layer on the second substrate,
wherein the first alignment layer and the second alignment layer comprise an alignment material comprising a reactive mesogen.

7. The mother substrate of claim 1 wherein
a pretilt angle of the liquid crystal molecules on the first subpixel electrode is different from a pretilt angle of the liquid crystal molecules on the second subpixel electrode.

8. The mother substrate of claim 7, further comprising a reactive mesogen to which ultraviolet rays is irradiated, to react the reactive mesogen,
wherein
the first subpixel electrode of the first substrate is applied with a first voltage from the first voltage application electrode outside the panel region of the second substrate, and the second subpixel electrode of the first substrate is applied with a second voltage from the second voltage application electrode outside the panel region of the second substrate, the second voltage different from the first voltage, and
the reactive mesogen irradiated with the ultraviolet rays, and the first and second subpixel electrodes applied with the different first and second voltages form the different pretilt angles of the liquid crystal molecules on the first and second subpixel electrodes, respectively.

9. The mother substrate of claim 1, further comprising a reactive mesogen to which ultraviolet rays is irradiated, to react the reactive mesogen,
wherein the reactive mesogen irradiated with the ultraviolet rays, and the first and second voltage application electrodes applied with the different first and second voltages, form different pretilt angles of liquid crystal molecules of the liquid crystal layer on the first and second subpixel electrodes, respectively.

* * * * *